United States Patent
Hamada

(10) Patent No.: US 7,475,306 B2
(45) Date of Patent: Jan. 6, 2009

(54) SCAN TEST METHOD, INTEGRATED CIRCUIT, AND SCAN TEST CIRCUIT

(75) Inventor: Hideki Hamada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 138 days.

(21) Appl. No.: 10/974,741

(22) Filed: Oct. 28, 2004

(65) Prior Publication Data

US 2005/0097415 A1 May 5, 2005

(30) Foreign Application Priority Data

Oct. 29, 2003 (JP) ............... 2003-368620

(51) Int. Cl.
*G01R 31/28* (2006.01)
*G06F 11/00* (2006.01)

(52) U.S. Cl. ................... 714/726; 714/736
(58) Field of Classification Search .............. None
See application file for complete search history.

(56) References Cited

U.S. PATENT DOCUMENTS 4,366,393 A * 12/1982 Kasuya ............... 326/16
5,390,189 A * 2/1995 Tateishi ............... 714/728
5,504,756 A * 4/1996 Kim et al. ............ 714/729
5,905,738 A * 5/1999 Whetsel ............... 714/732

FOREIGN PATENT DOCUMENTS

JP 05-134007 A 5/1993

* cited by examiner

*Primary Examiner*—Christine T Tu
(74) *Attorney, Agent, or Firm*—Sughrue Mion, PLLC

(57) ABSTRACT

A scan test method of an integrated circuit including a combinational circuit and flip-flops forming a scan chain is disclosed. The method first sets an initial test value to the flip-flops forming the scan chain by serial scan input. Then, it repeats a capture operation and a feedback shift operation. The capture operation captures an output of the combinational circuit, to which a value set to a flip-flop has been applied, by another flip-flop. The feedback shift operation feeds an output of the scan chain back to an input side of the scan chain for re-input during a shift operation in the scan chain. Finally, it compares an output of the scan chain with an expected value.

14 Claims, 7 Drawing Sheets

SCAN TEST METHOD, INTEGRATED CIRCUIT, AND SCAN TEST CIRCUIT

BACKGROUND OF THE INVENTION

1. Field of the Invention

The present invention relates to a scan test method, an integrated circuit, and a scan test circuit.

2. Description of Related Art

A scan test is a technique to test an integrated circuit to detect defects. The scan test requires a scan chain placed in the integrated circuit. The scan chain includes flip-flops connected in series to form a shift register.

A combinational circuit has its output determined entirely by concurrent inputs. Thus, the presence of defects in the combinational circuit can be detected as follows. First, an input is applied to the combinational circuit, and the output of the combinational circuit is provided to the flip-flops by capture operation. The captured values are then output serially by the scan chain and compared with an expected value. From the comparison result, the presence or absence of defects in the combinational circuit is determined.

Referring first to FIGS. 5 and 6, a conventional integrated circuit (IC) 100 having a scan test function includes combinational circuits 101a, 101b, 101c, and flip-flops 111, 112, 113, 114. The flip-flops 111 to 114 are placed between the combinational circuits. The flip-flops 111 to 114 are connected in series with each other to serve as a shift register, thereby forming a scan chain 110.

Each of the flip-flops 111 to 114 is a scan cell having a multiplexer (not shown). The multiplexer allows switching a shift register operation mode and a capture operation mode. In the capture operation mode, values pass through the combinational circuits. The multiplexer selects the output of the combinational circuit in the normal operation mode and selects the output of the flip-flop of the previous stage in the shift register operation mode. The multiplexer then inputs the selected output to the flip-flop of the next stage.

FIG. 5 schematically shows a conventional IC in the shift register operation mode. FIG. 6 schematically shows the conventional IC in the capture operation mode.

For simplification, FIGS. 5 and 6 show only one scan chain, four flip-flops forming the scan chain, and three combinational circuits. An actual circuit, however, includes more flip-flops and combination circuits in the left side of the combination circuit 101a and in the right side of the combination circuit 101c of FIGS. 5 and 6. The number of scan chains and flip-flops forming each scan chain depend on the size of the IC 100.

The scan test of the IC 100 is explained below with reference to FIG. 7.

Initialization (S101)

Initially in the scan test process, the IC 100 is set in the mode shown in FIG. 5. A test value of "1" or "0" is set to all the flip-flops forming the scan chain 110. For example, the values "1", "1", "1", "1" are set to the flip-flops 111 to 114. These values are serially input to the flip-flops 111 to 114 of the scan chain 110 from an input terminal 110a of the scan chain 110 in synchronization with a clock signal input to the flip-flops 111 to 114 from a clock input terminal (not shown). This operation, called the shift operation, is repeated the number of stages of the flip-flops 111 to 114 forming the scan chain 110, thereby setting the values to all the flip-flops 111 to 114.

Capture Operation (S102)

Next, the IC 100 is set in the capture operation mode shown in FIG. 6. The values of the flip-flops 111 to 114 set in the previous step S101 are captured by other flip-flops through the combinational circuits 101a to 101c. The values of the flip-flops 111 to 114 are thereby updated. The capture operation is unidirectional in the direction of the arrow B in FIG. 6.

Output, Comparison, and Reset (S103)

Then, the IC 100 is set in the shift register operation mode again. The values of the flip-flops 111 to 114 are output from an output terminal 110b of the scan chain 110. These output values are compared with an expected value to see if they match. In parallel with the output, next values are input to the flip-flops 111 to 114 of the scan chain 110 to reset them. The next values are different from the values input previously. In this case, since the values "1", "1", "1", "1" have been input initially, the values "1", "1", "1", "0", for example, are input in this step. The values of the flip-flops 111 to 114 are thereby updated.

The steps S102 to S103 are repeated the number of times required to detect defects in all the part of the combinational circuits 101a to 101c. The process determines if the repeat number reaches a preset number in the step S104 in FIG. 7. If not, the process repeats from S102, and, if so, the process ends.

If any comparison result of a plurality of comparisons shows that the output value is different from the expected value, the IC 100 is determined to be defective. If it shows that all the output values are the same as the expected value, the IC 100 is determined to be non-defective.

The expected value is a value to be output if the IC 100 is non-defective. This value is calculated by simulation based on input values and the configuration of the combinational circuits.

Another conventional scan test method is described in Japanese Unexamined Patent Application Publication No. 05-134007 (Yamashita) and illustrated in FIGS. 1 and 2. This technique feeds the output of a scan chain through a logic circuit L1 in FIG. 1 or L2 in FIG. 2 back to an input terminal of the scan chain for re-input, thereby compressing the data of a test pattern, which is a test vector for scan pass in this art. Since this technique inverts the re-input value to a specific flip-flop by the logic circuit L1 or L2, it allows update and reset of the value of each flip-flop without input of a new test pattern.

In the IC 100 shown in FIGS. 5 and 6, if the number of times to perform the capture operations is "m", the number of flip-flops of the scan chain 110 corresponding to the number of clocks required for serial data input by the scan pass is "n", and the number of clocks required for one capture operation is "c", the number of test patterns (clocks) required is given by:

$$m*(n+c)+n \tag{1}$$

where the values of "m", "n", and "c" are positive integers. For example, the value "m" is 3000 to 10000, "n" is 10000 to 200000, and "c" is 1. This means that the value of "n" is the most critical for the test pattern number.

The present invention has recognized that, it is necessary in the IC 100 to input a new value from the input terminal of the scan chain to set it to the flip-flops each time the capture operation is performed. This requires a large number of test patterns (clocks) and takes a long test time. Further, it is necessary to store all the input values supplied each time, requiring a large memory capacity. Furthermore, since the output of the scan chain is compared with the expected value in each capture operation, it is necessary to store a large number of expected values for comparison, also requiring a large memory capacity. In addition, the comparison takes a long time to process a large amount of data.

The present invention has also recognized that, the technique taught by Yamashita requires the logic circuit L1 or L2 for inverting the re-input value to a specific flip-flop. It further requires data for determining a signal, "1" or "0", to be input to an input terminal DAT1 (or DAT2) of the logic circuit L1 (or L2) from test vector memory MEM1 (or MEM2). This inhibits the reduction of the amount of data required.

SUMMARY OF THE INVENTION

According to one aspect of the present invention, there is provided a scan test method of an integrated circuit including a combinational circuit and flip-flops forming a scan chain. The method includes setting an initial test value to the flip-flops forming the scan chain by serial scan input, repeating a capture operation and a feedback shift operation, and comparing an output of the scan chain with an expected value. The capture operation captures an output of the combinational circuit, to which a value set to a flip-flop has been applied, by another flip-flop. The feedback shift operation feeds an output of the scan chain back to an input side of the scan chain for re-input during a shift operation in the scan chain.

Since the scan test method of this invention repeats the capture operation and the feedback shift operation, a value captured by the flip-flop in the capture operation through the combinational circuit is re-used for the capture operation through the combinational circuit. It is thereby possible to update values of the flip-flops sequentially and randomly without input of new test patterns from an input side of the scan chain. This allows suitable checking of the combinational circuits.

The scan test method of this invention thus reduces the number of test patterns (clocks) and a memory capacity required for the scan test, compared to the conventional techniques shown in FIGS. 5 to 7. Further, since this method performs comparison after repetition of the capture operation and the feedback shift operation, it reduces the number of expected values for the comparison and the capacity of memory for storing these values and also shortens a processing time compared to the conventional techniques shown in FIGS. 5 to 7 that performs comparison after each capture operation.

Furthermore, the scan test method of this invention does not require the logic circuit L1 or L2 nor data for determining which signal, "1" or "0", is to be input to the input terminal DAT1 (or DAT2) of the logic circuit, which have been required in the technique taught by Yamashita. It is thereby possible to reduce the amount of data necessary and a memory capacity for storing the data compared to the technique of Yamashita.

The present invention provides a scan test method, an integrated circuit, and a scan test circuit which can reduce the number of test patterns (clocks) and a memory capacity required for the scan test.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferred embodiments of the present invention are explained hereinafter with reference to the drawings.

Figure 1:
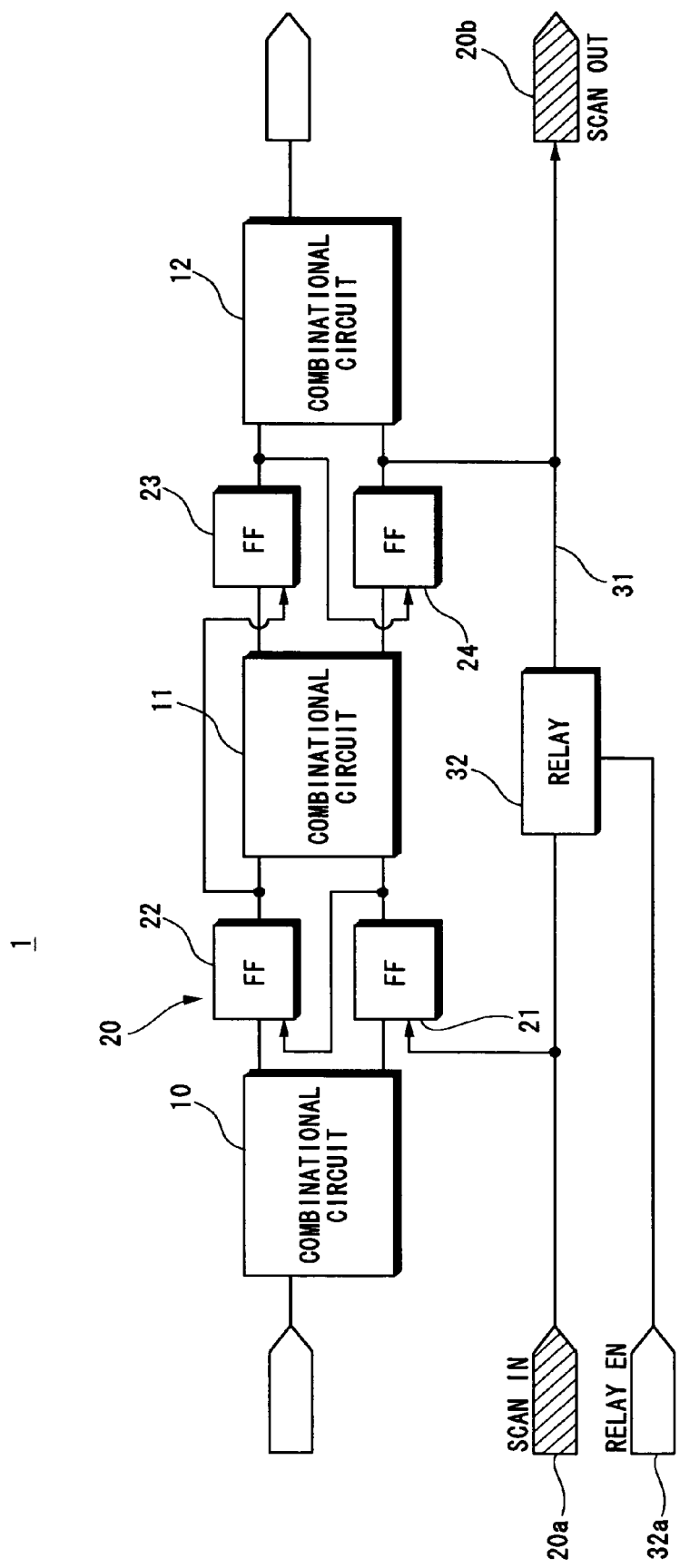
FIG. 1 is a schematic diagram showing an IC in a mode to input a test pattern to a scan chain according to an embodiment of the invention.
Figure 2:
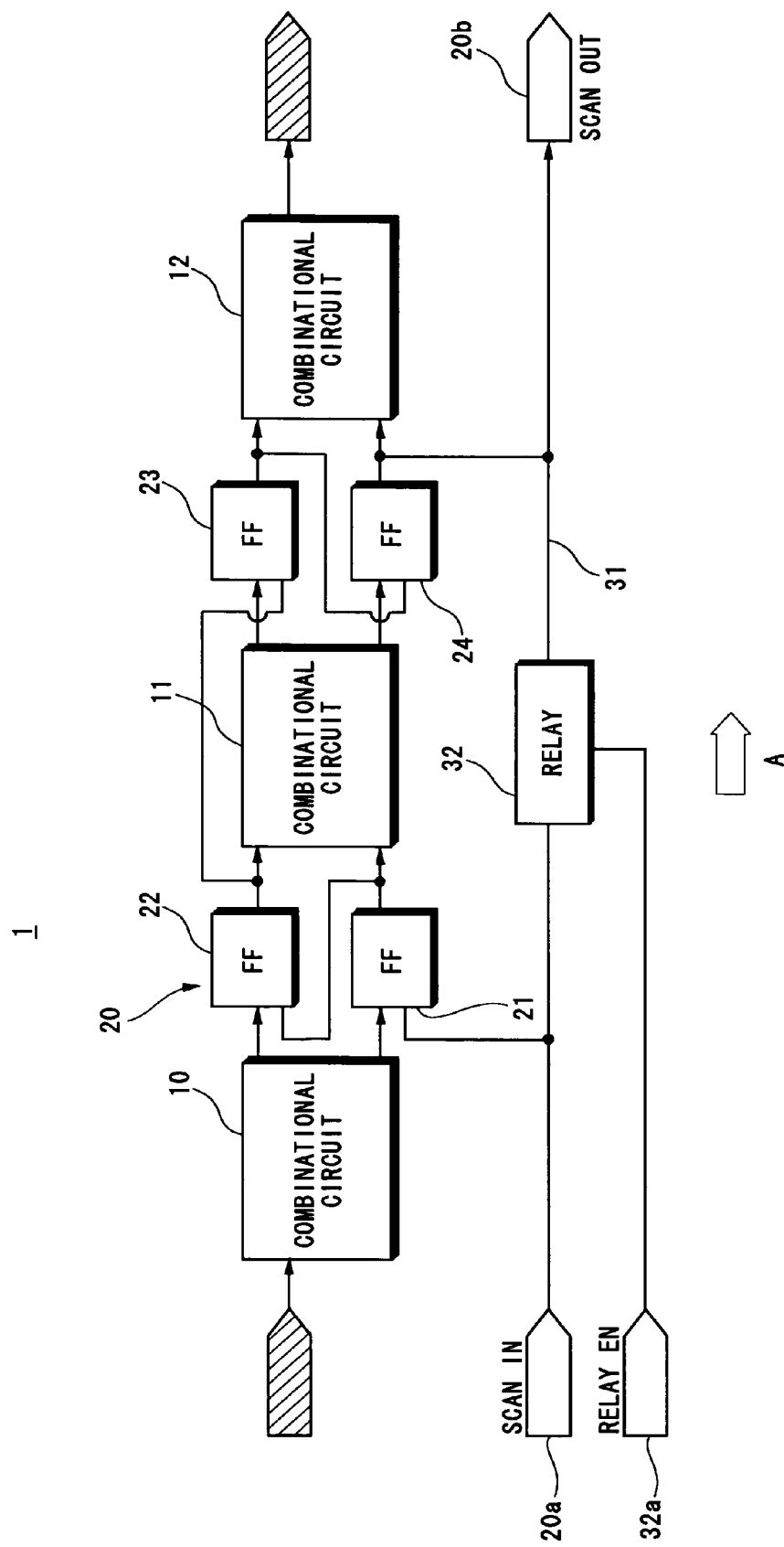
FIG. 2 is a schematic diagram showing the IC of FIG. 1 in a capture operation mode.
Figure 3:
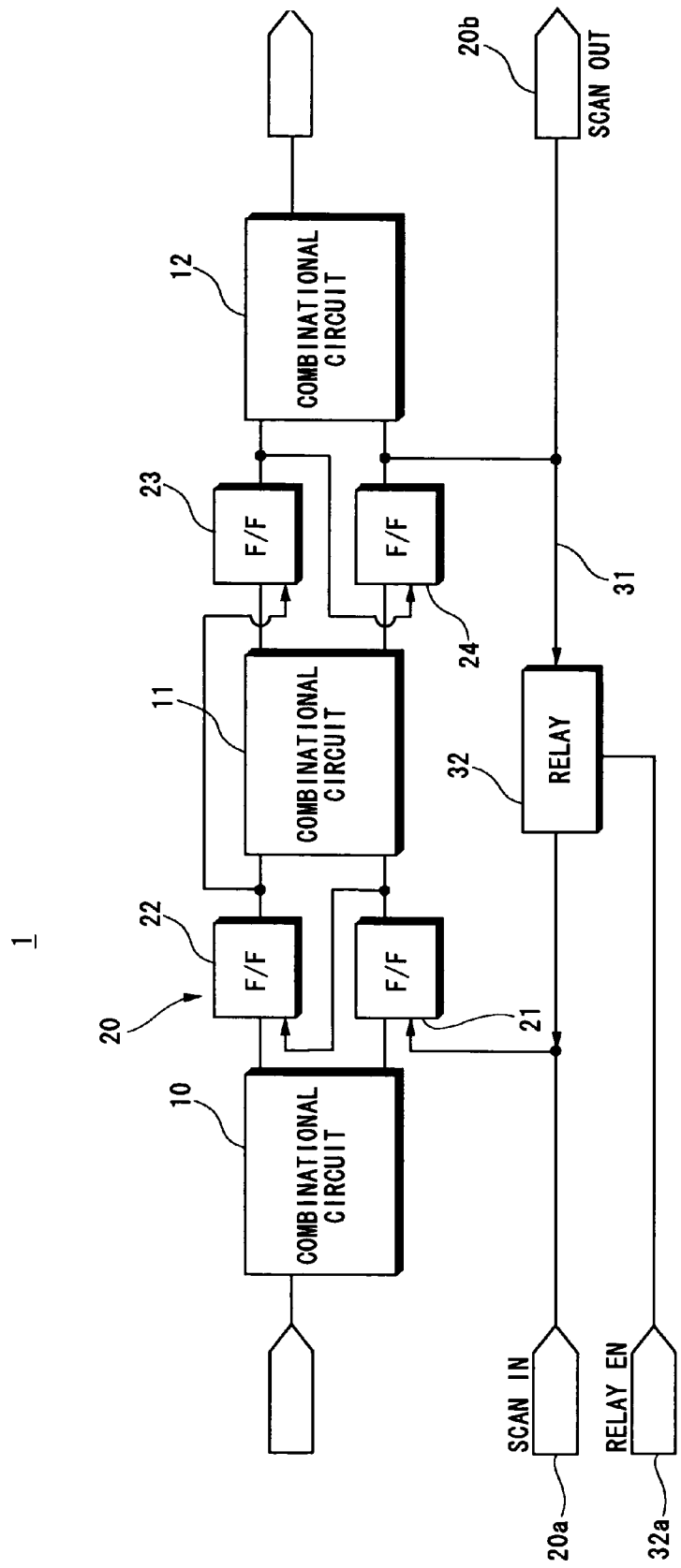
FIG. 3 is a schematic diagram showing the IC of FIG. 1 in a shift operation mode where values pass through a feedback input system.

An integrated circuit (IC) 1 of a first embodiment includes combinational circuits 10, 11, 12 and flip-flops 21, 22, 23, 24, as shown in FIGS. 1 to 3. The flip-flops 21 and 22 are placed between the combinational circuits 10 and 11. The flip-flops 23 and 24 are placed between the combinational circuits 11 and 12. The flip-flops 21 to 24 are connected in series with each other to serve as a shift register, thereby forming a scan chain 20.

Each of the flip-flops 21 to 24 is a scan cell having a multiplexer (not shown). The multiplexer allows switching a shift register operation mode and a capture operation mode. In the capture operation mode, values pass through the combinational circuits. The multiplexer selects the output of the combinational circuit in the normal operation mode and selects the output of the flip-flop of the previous stage in the shift register operation mode. The multiplexer then inputs the selected output to the flip-flop of the next stage.

FIG. 1 shows the IC 1 in the shift register operation (shift operation) mode. FIG. 2 shows the IC 1 in the capture operation mode.

The IC1 includes a line (transmission path) 31 for feeding the output from an output terminal 20b of the scan chain 20 back to an input terminal 20a of the scan chain 20 for re-input, and a relay (switching means) 32, which is a switch circuit in the line 31. The relay 32 switches between a close state and an open state. The close state allows the output from the output terminal 20b to re-input to the input terminal 20a through the line 31, and the open state does not allow that. The relay 32 switches between the states according to a control signal from the input terminal 32a. When the relay 32 is closed, the output terminal 20b and the input terminal 20a of the scan chain 20 are connected directly without any other circuit placed therebetween. Performing the shift operation in the scan chain 20 in this state allows feedback of the output of the scan chain 20 to the input side thereof without change. The line 31 and the relay 32 thus constitute a feedback input system.

FIG. 3 shows the IC 1 where the relay 32 is closed to allow the shift operation via the feedback input system.

For simplification, FIGS. 1 to 3 show only one scan chain, four flip-flops forming the scan chain, and three combinational circuits. An actual circuit, however, includes more flip-flops and combination circuits in the left side of the combination circuit 10 and in the right side of the combination circuit 12 of FIGS. 1 to 3. The number of scan chains and flip-flops forming the scan chain depend on the size of the IC 1.

Figure 4:
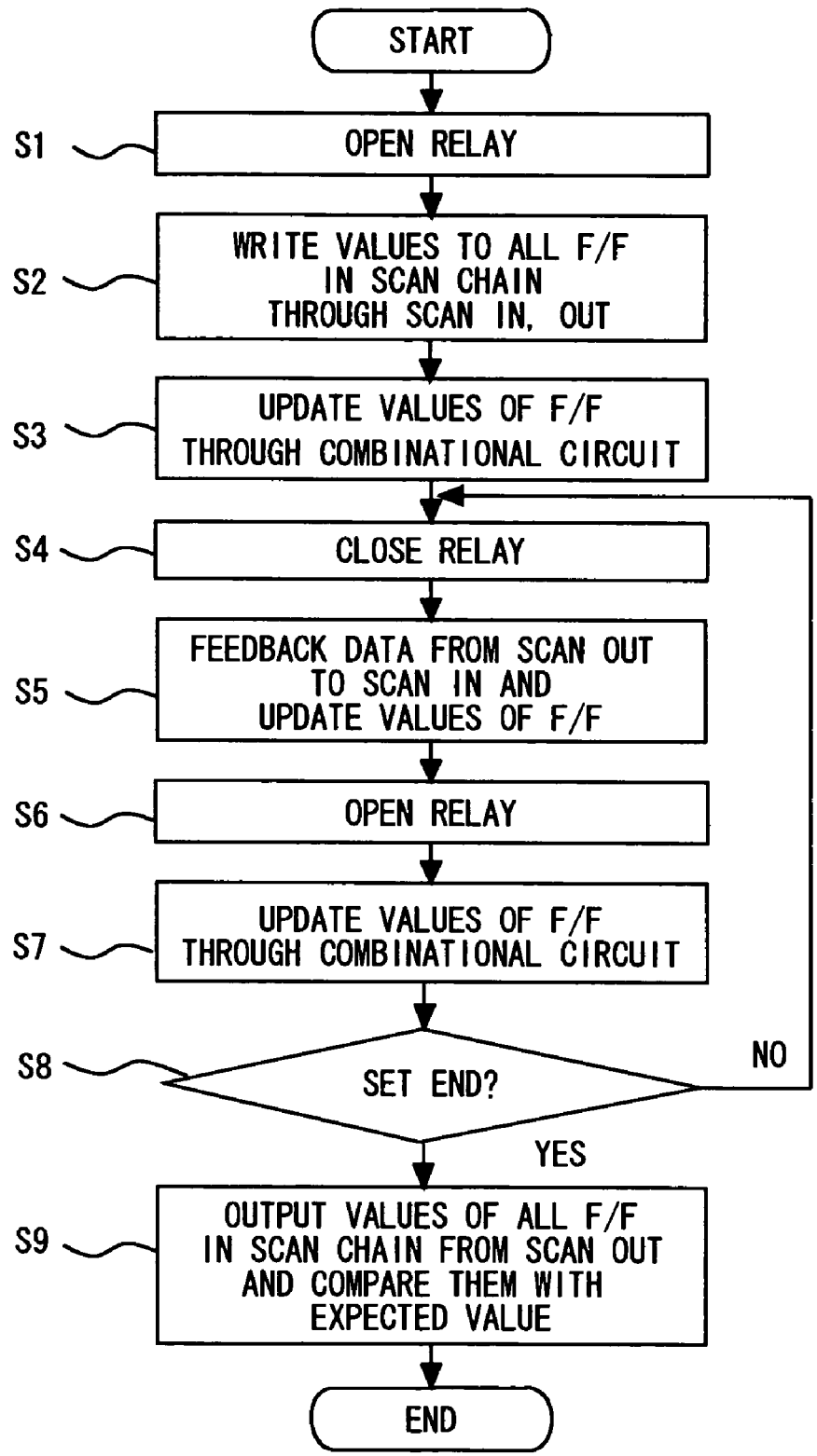
FIG. 4 is a flowchart showing a process of a scan test in the IC of FIG. 1.
Figure 5:
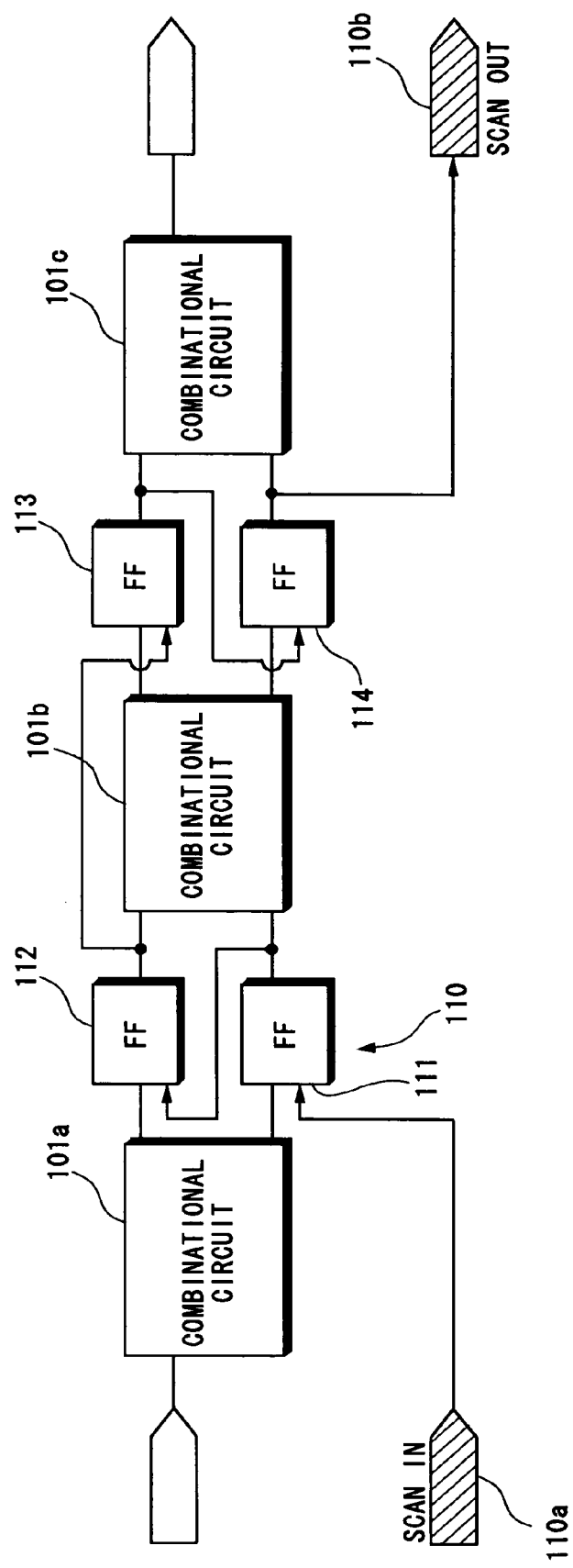
FIG. 5 is a schematic diagram showing a conventional IC having a scan test function in a mode to input a test pattern to a scan chain.
Figure 6:
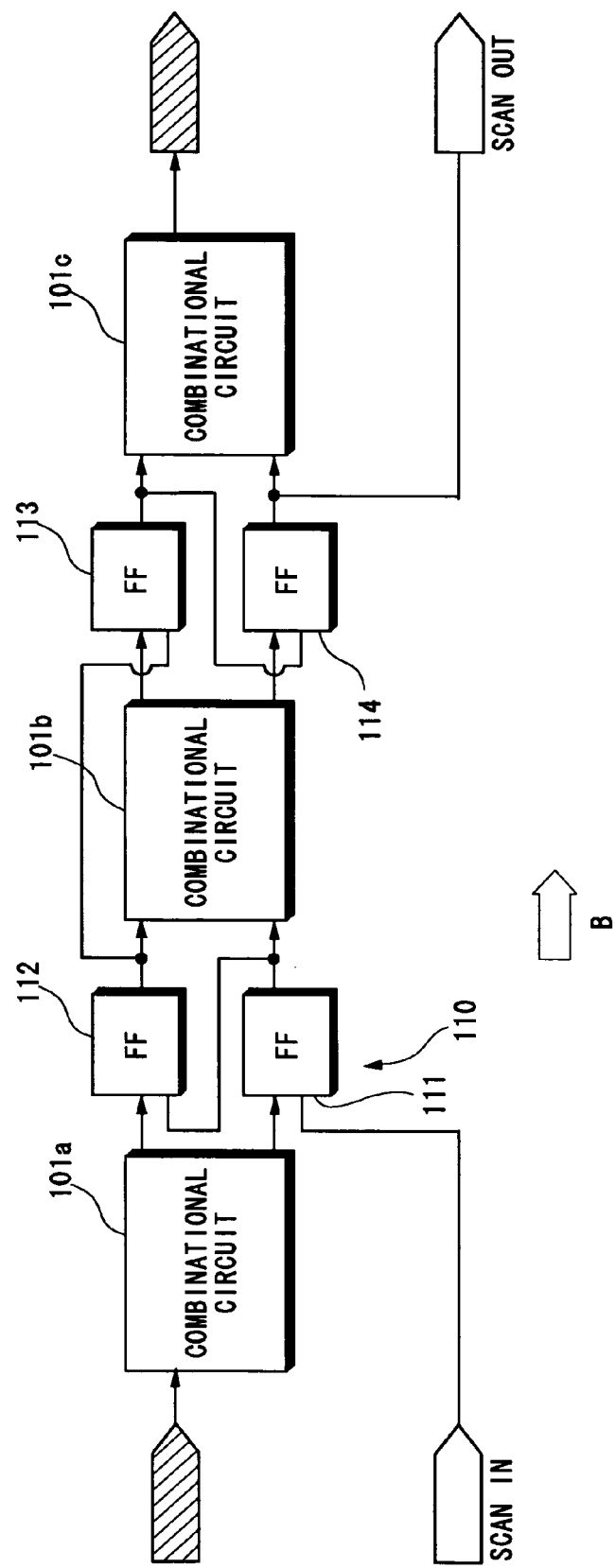
FIG. 6 is a schematic diagram showing the IC of FIG. 5 in a capture operation mode.
Figure 7:
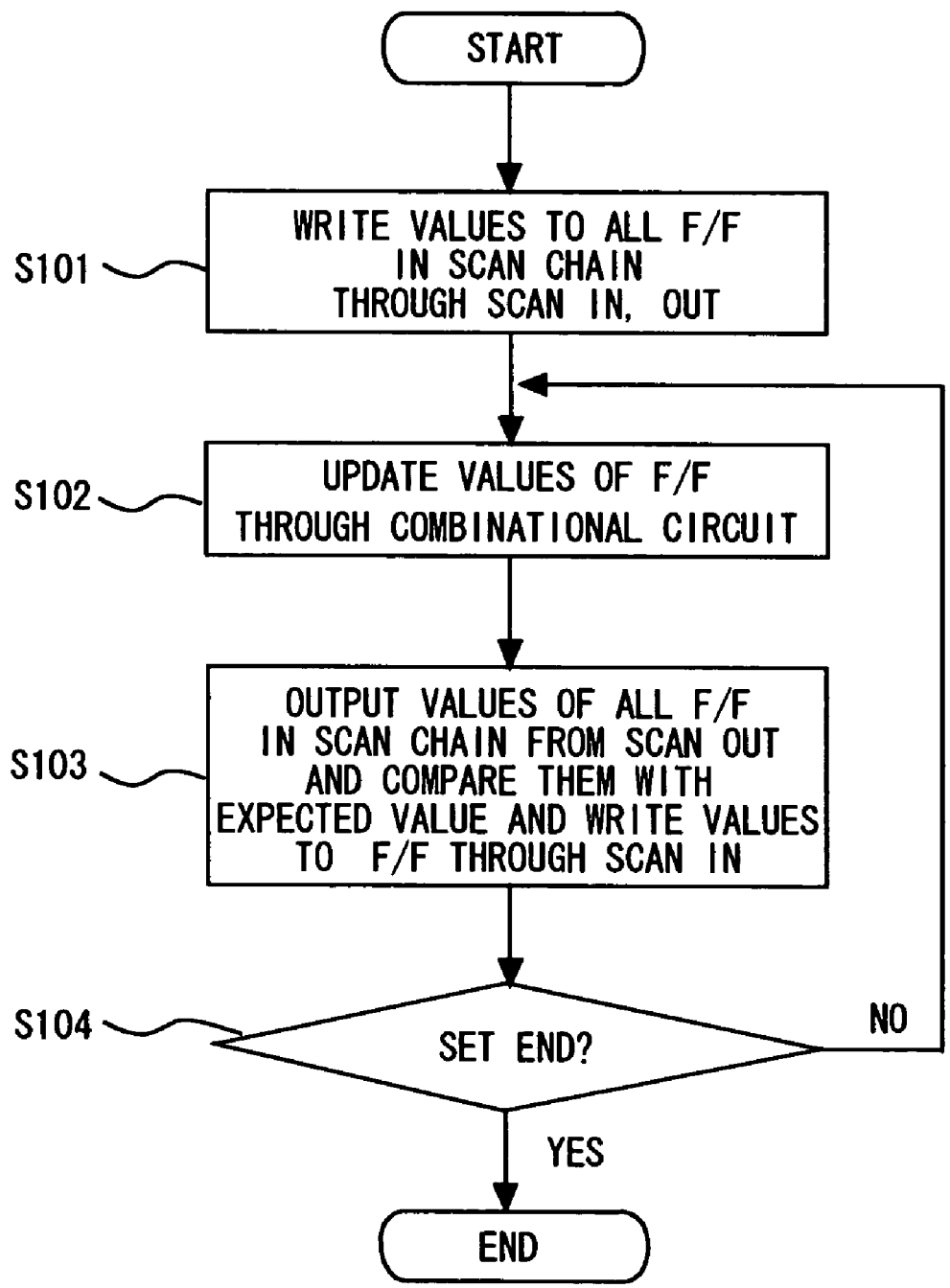
FIG. 7 is a flowchart showing a process of a scan test in the IC of FIG. 5.

The scan test of the IC 1 is explained below with reference to FIG. 4.

Initialization (Initial Input Step)

Initially in the scan test process, the relays 32 is opened to set the IC 1 in the scan path operation mode of FIG. 1 (S1). A test value of "1" or "0" is set to all the flip-flops forming the scan chain 20 (S2). For example, the values "1", "1", "1", "1" are set to the flip-flops 21 to 24. These values are sequentially input to the flip-flops 21 to 24 of the scan chain 20 from the input terminal 20a of the scan chain 20 in synchronization with a clock signal input to the flip-flops 21 to 24 from a clock input terminal (not shown). The test signals flow in the direction of the arrows in FIG. 1. This operation, which is the shift operation, is repeated the number of stages of the flip-flops 21 to 24 forming the scan chain 20.

In the operation mode of FIG. 1, in the first shift operation on one clock cycle, a value is set to the flip-flop 21 of the first stage. Then, in the second shift operation, the values of the flip-flops are shifted one by one clockwise in FIG. 1. The value of the flip-flop 21 is thereby input to the flip-flop 22, and a next value is set to the flip-flop 21 and latched. Similarly, in the third shift operation, a next value is set to the flip-flop 21, the value latched in the flip-flop 21 is input to the flip-flop 22, and the value latched in the flip-flop 22 is input to the flip-flop 23, and latched. Further, in the fourth shift operation, a next value is set to the flip-flop 21, the value latched in the flip-flop 21 is input to the flip-flop 22, the value latched in the flip-flop 22 is input to the flip-flop 23, and the value latched in the flip-flop 23 is input to the flip-flop 24, and latched. All the flip-flops 21 to 24 thereby have the values set.

Capture Operation

Next, the IC 100 is set in the normal operation mode using the combinational circuits as shown in FIG. 2. The values of the flip-flops 21 to 24 set in the previous step S1 are captured by other flip-flops through the combinational circuits 11 or 12 (S3) The signal flows in the direction of the arrows in FIG. 2. The values of the flip-flops 21 to 24 are applied to the combinational circuits 11 or 12, and the output of the combinational circuits 11 or 12 is captured by another flip-flop. The values of the flip-flops 21 to 24 are thereby updated. The capture operation is unidirectional in the direction of the arrow A in FIG. 2.

Specifically, the outputs of the combinational circuit 10 are captured by the flip-flops 21 and 22. This output values are originally the values which have been latched in flip-flops (not shown) in the left side of the combinational circuit 10 in the step S1 and updated through the combinational circuit 10. The outputs of the combinational circuit 11 are captured by the flip-flops 23 and 24. This output values are originally the values which have been latched in the flip-flops 21 and 22 in the left side of the combinational circuit 11 in the step S1 and updated through the combinational circuit 11. The values which have been latched in the flip-flops 23 and 24 in the step S1 are applied to the combinational circuit 12 and updated therein, and then captured by the flip-flops (not shown) in the right side of the combinational circuit 12.

In the capture operation, the values of the flip-flops are updated through the combinational circuit and captured by other flip-flops.

The relay 32 is open in the capture operation mode of FIG. 2 as well.

Feedback Shift

Then, the relay 32 is closed to set the IC 1 in the operation mode of FIG. 3 (S4). This step feeds the output of the scan chain 20 back to the input side of the scan chain 20 for re-input without changing the output value while performing the shift operation in the scan chain 20. This is called the feedback shift. The feedback shift is performed in the state where the output side (output terminal 20b) of the scan chain 20 is directly connected to the input side (input terminal 20a) of the same.

The values of the flip-flops 21 to 24 are shifted one by one clockwise in FIG. 3 by each shift operation on each clock cycle. The value of the flip-flop 21 is shifted by one and input to the flip-flop 22 and latched. Similarly, the value which has been latched in the flip-flop 22 is then latched in the flip-flop 23, and the value which has been latched in the flip-flop 23 is then latched in the flip-flop 24. The value which has been latched in the flip-flop 24 is input to the flip-flop 21 through the line 31 and the relay 32 and latched (S5).

The number of times to perform the shift operations, which is, the number of clocks in one feedback shifting is set to a positive integers of (N−1) or less where N is the number of flip-flops forming the scan chain. Since the scan chain 20 shown in FIGS. 1 to 3 have 4 flip-flops, the number of times of shifts in one feedback shifting is set to 1, 2, or 3. This avoid that the values of the flip-flops 21 to 24 are shifted round and back to the original values. In this embodiment, the number of shifts is set to 1, for example, and this number is fixed and remains unchanged in the feedback shifting repeated a plurality of times after that. Thus, if the number of flip-flops forming the scan chain is N (N is a positive integer of 2 or greater), the number of shift operations in every feedback shifting is fixed to a certain number within a range from 1 to (N−1).

Repeat

The capture operation and the feedback shift operation are repeated the predetermined number of times. This is called the capture repeat step. The capture repeat step repeats the steps S4 to S8.

The capture operation (S7) that follows the feedback shift operation is performed in the state where the relay 32 is opened (S6). The step S8 determines if the repeated number reaches the preset number, and if not, the process repeats the steps S4 to S8, and if so, the process proceeds to the next step S9.

The capture repeat step randomly updates the values of the flip-flops 21 to 24 forming the scan chain 20. It is thereby possible to set a different value (test pattern) to each of the flip-flops 21 to 24 with a high probability in each capture operation.

Comparison

Upon completion of the capture repeat step for the predetermined number of times, the IC 1 is set in the mode of FIG. 1 where the relay 32 is open. The values of the flip-flops 21 to 24 of the scan chain 20 are output from the output terminal 20b and compared with an expected value to see if they match.

The expected value is previously calculated from simulation based on an initial input value, the circuit configuration of the combinational circuits 10, 11, and 12, the number of repeat times of the capture operation, and the number of shifts.

If the output value is equal to the expected value, the IC 1 is determined to be non-defective. If, on the other hand, the output value is different from the expected value, the IC 1 is determined to be defective.

As described above, the scan test process of this invention first performs the initial input step that inputs initial test values to the flip-flop 21 to 24 of the scan chain 20. Then, the process performs the capture repeat step that repeats the capture operation and the feedback shift operation alternately. The capture operation captures the output of the combinational circuit, to which the value of one flip-flop has been applied, by another flip-flop. The feedback shift operation feeds the output of the scan chain 20 back to the input side thereof for re-input during the shift operation in the scan chain 20. Finally, the process performs the comparison step that compares the output of the scan chain 20 with an expected value.

The scan test process performs a series of steps consisting of the initial input step, the capture repeat step repeating the capture operation and the feedback shifting, and the comparison step only once. Thus, the comparison result is performed once as a final step of the scan test.

According to the first embodiment, by the capture repeat step, the output of the combinational circuit captured by the flip-flop in the capture operation is re-input to the combinational circuit and re-used in the next capture operation. The capture repeat step thus allows updating the values of the flip-flops sequentially and randomly without input of new test patterns from the input side of the scan chain. The combinational circuits can be thereby checked suitably.

This embodiment thereby significantly reduces the number of test patterns (clocks) and a memory capacity required for the scan test. Further, since it performs only one time of the comparison step after a series of capture operation and feedback shift operation, it is possible to reduce the number of expected values for comparison and the capacity of memory for storing these values and also a processing time compared to the conventional process which compares the values after each capture operation.

This embodiment sets initial values to the flip-flops of the scan chain only at the initialization step, and compares the output values of the flip-flops with an expected value only at the final step. Hence, the minimum number of test patterns required as a fixed value is the number of flip-flops times two, which corresponds to the number of clocks required for serial data input and output by the scan path.

If the number of times of the capture operations is "M", the number of flip-flops forming the scan chain 20 is "N", the number of clocks required for one capture operation is "C", and the number of shifts in one feedback shifting is "S", the number of clocks required is given by:

$$M*(S+C)+(2*N) \qquad (2)$$

In the above expression (2), the values of "M", "S", "C", "N" are all positive integers. For example, N is 10000 to 200000, and "C" is 1, as in the conventional technique. In this embodiment, "S" is 1, for example. The value of "M" is expected to be greater than the range of 3000 to 10000 in the conventional technique, but it is not as great as the value of "N". Thus, the value of "N" is most critical for the test pattern number (clock number). However, in the first term of the expression (2), the value "N" is not multiplexed with the value "M", which is the number of times of capture operation, unlike the expression (1) of the conventional technique. Thus, the present embodiment can reduce the number of clocks compared to the conventional case, which reduces the test time.

In this embodiment, it is preferred to set the number of shifts "S" in one feedback shift operation to be smaller than the number of flip-flops "N" so as to reduce the number of clocks and test time. For example, the minimum number 1 may be selected. In order to prevent the same value from input to the same flip-flop by the feedback shifting, the number of shifts should be different from the number of flip-flops "N" or the multiple of "N" if the shift number is fixed.

This embodiment can determine if the IC 1 is defective or non-defective with one-time comparison performed at the end of the scan test process for the following reasons.

In this embodiment, by the capture repeat step, the output of the combinational circuit captured by the flip-flop of the next stage in the capture operation is re-input to the combinational circuit and re-used in the next capture operation. The values of the flip-flops are thereby sequentially and randomly updated; in addition, the output values indicating the test result of the combinational circuit is re-used for the testing of the next combinational circuit. Hence, the output value which has passed a defective circuit once does not match the expected value in the last result. It is thereby possible to determined if the IC 1 is defective or not with one-time comparison.

Though the scan test method of this invention has a slight possibility that an output value matches an expected value by accidence in spite of defects, the possibility is very low, and it is possible to detect defects with a very high probability. This embodiment is thus capable of defect detection at a high detection rate with a significantly smaller number of patterns.

Another embodiment that allows the scan test at a higher detection rate than the scan test of the first embodiment is explained hereinafter. The scan test process of the second embodiment repeats a series of steps consisting of the initial input step, the capture repeat step, and the comparison step while changing an initial value each time or once in several times. The process thus repeats the steps S2 to S9 of FIG. 4.

In each step, the part which is not scanned and thus not checked can be determined from simulation based on an initial input value, the circuit configuration of the combinational circuits 10, 11, and 12, the number of repeat times of the capture operation, and the number of shifts. Thus, the initial input value for the next series of steps is selected to check this part.

The capture operations in each capture repeat step is repeated the optimal number of times which is predetermined by the simulation, for example. The simulation is performed based on an initial input value, the circuit configuration of the combinational circuits 10, 11, and 12, and the number of shifts. Specifically, the optimal number of times to perform the capture operations in one capture repeat step is such that further repetition of the capture operations does not increase a detection rate any more.

Since the second embodiment repeats a series of steps consisting of the initial input step, the capture repeat step, and the comparison step, and changes an initial value each time, it is possible to increase a defect detection rate, thereby performing the test of the IC 1 more reliably.

The second embodiment thus allows defect detection at a higher defection rate while maintaining the advantages of reduced clock number and test time of the first embodiment.

Though the above embodiments explain the case where the feedback shift system including the line 31 and the relay 32 is placed inside the IC 1, they may be placed outside the IC 1. For example, the feedback shift system may be placed in a test board (scan test circuit) for performing the scan test, which gives the same effect as above.

Further, though the above embodiments explain the case where the number of times of shifts in the feedback shift operation is constant, it may be set to variables or a given value each time.

The number of scan chains in the IC can be determined arbitrarily. If the IC includes a plurality of scan chains, the feedback system (transmission path and switching means) is placed for each scan chain. In this case, the number of flip-flops forming the scan chain may be different for each scan chain.

The flip-flops of the scan chain may be used both for the scan test and a user logic, or, only for the scan test. In the former case, the flip-flops operate also when the IC acts as a product. In the latter case, the flip-flops are used only for the inspection of product before shipment, and they do not operate when the IC acts as a product.

It is apparent that the present invention is not limited to the above embodiment, that may be modified and changed without departing from the scope and spirit of the invention.

What is claimed is:

1. A scan test method of an integrated circuit including a combinational circuit, there being a flip-flop coupled to an input of the combination circuit and a flip-flop coupled to an output of the combination circuit, said flip-flops forming a scan chain, comprising:
    setting initial test values to the flip-flops forming the scan chain;
    performing a first capture operation whereby a first output of the combination circuit is captured by said flip-flop coupled to the output of the combination circuit;
    performing a feedback shift operation feeding said first output of the scan chain back to an input side of the scan chain for re-input during a shift operation in the scan chain;
    performing a second capture operation, whereby a second output of the combination circuit based on inputting said first output to said combination circuit is captured by said flip-flop coupled to the output of the combination circuit; and
    comparing said second output of the scan chain, output after performing the second capture operation, with an expected value.

2. The scan test method according to claim 1, wherein each of the capture operation and the feedback shift operation are performed alternately for a predetermined number of times.

3. The scan test method according to claim 2, wherein, if the number of flip-flops forming the scan chain is N where N is a positive integer of 2 or greater, the number of times to perform the shift operation in each feedback shift operation is 1 or greater, and not a multiple of N.

4. The scan test method according to claim 3, wherein the number of times to perform the shift operation in each feedback shift operation is within a range of 1 to (N−1).

5. The scan test method according to claim 4, wherein another initial test value is set to the flip-flops forming the scan chain during performing of each of the capture operation and the feedback shift operation.

6. The scan test method according to claim 3, wherein another initial test value is set to the flip-flops forming the scan chain during performing of each of the capture operation and the feedback shift operation.

7. The scan test method according to claim 2, wherein another initial test value is set to the flip-flops forming the scan chain during performing of each of the capture operation and the feedback shift operation.

8. The scan test method according to claim 1, wherein, if the number of flip-flops forming the scan chain is N where N is a positive integer of 2 or greater, the number of times to perform the shift operation in each feedback shift operation is set to 1 or greater, and not a multiple of N.

9. The scan test method according to claim 8, wherein the number of times to perform the shift operation in each feedback shift operation is within a range of 1 to (N−1).

10. The scan test method according to claim 9, wherein another initial test value is set to the flip-flops forming the scan chain during performing of each of the capture operation and the feedback shift operation.

11. The scan test method according to claim 8, wherein another initial test value is set to the flip-flops forming the scan chain during performing of each of the capture operation and the feedback shift operation.

12. A scan test method of an integrated circuit including a combinational circuit, there being a flip-flop coupled to an input of the combination circuit and a flip-flop coupled to an output of the combination circuit, said flip-flops forming a scan chain, comprising:
    setting initial test values to the flip-flops forming the scan chain;
    performing a first capture operation whereby an output of the combination circuit is captured by said flip-flop coupled to the output of the combination circuit;
    performing a feedback shift operation feeding an output of the scan chain back to an input side of the scan chain for re-input during a shift operation in the scan chain;
    performing a second capture operation, after the feedback shift operation, whereby an output of the combination circuit is captured by said flip-flop coupled to the output of the combination circuit;
    performing a capture repeat operation comprising performing the feedback shift operation and the second capture operation at least once; and
    comparing an output of the scan chain, output after performing the capture repeat operation, with an expected value.

13. The scan test method according to claim 1, further comprising outputting all the values stored in the flip-flops forming the scan chain.

14. The scan test method according to claim 1, wherein no additional test patterns are read into the scan chain from the input side of the scan chain.

* * * * *